May 30, 1967 H. DaCOSTA 3,323,022

PACKAGE FOR DISCRETE AND INTEGRATED CIRCUIT COMPONENTS

Filed Aug. 23, 1965

(Actual Size)

INVENTOR.
Harry daCosta

BY

Mueller, Aichele & Rauner

ATT'YS.

United States Patent Office 3,323,022
Patented May 30, 1967

3,323,022

PACKAGE FOR DISCRETE AND INTEGRATED CIRCUIT COMPONENTS

Harry da Costa, Phoenix, Ariz., assignor to Motorola, Inc., Franklin Park, Ill., a corporation of Illinois Filed Aug. 23, 1965, Ser. No. 481,851
6 Claims. (Cl. 317—101)

This invention relates to semiconductor devices and more particularly, to a novel structure having both semiconductor circuit elements and thermally and environmentally incompatible circuit elements.

Semiconductor circuit elements, such as diodes, transistors, and integrated circuits, have made feasible electrical assemblies of decreasing size. Besides the benefit of decreasing size, these assemblies that use semiconductor elements generally display superior reliability and ruggedness when compared with conventional vacuum tube assemblies.

The use of semiconductor material has permitted the production of very complicated electrical circuits as small as about 40 mil square. Although almost all types of electrical units can be produced on semiconductor material, there are certain limitations, such as electrical power capabilities, reliability, and manufacturing cost, which make the fabrication on semiconductor material of certain of these electrical units undesirable. Toroidal coils and capacitors are some examples of these "incompatible electrical units" which are often used with integrated circuits. These will be referred to hereinafter as "non-integrated components." They are generally thermally and environmentally incompatible with semiconductor circuit manufacture. These non-integrated components are usually minute in size when compared with standard electrical units. The limitation on the size and the requirement of high reliability of the integrated circuit has made the use of these non-integrated components desirable in some situations.

These non-integrated components, generally, are packaged separately from the semiconductor element because they are adversely affected by the elevated temperatures associated with the encapsulation and stabilization of the semiconductor, and because these components do not require the carefully controlled environmental conditions associated therewith. This separate packaging system results in a number of undesirable effects, two of which are: an increased overall weight of the assembled unit and an increased overall cost because of the additional wiring required.

If these non-integrated components are encapsulated in the same container with the semiconductor element, additional cost may be incurred because of the high rate of failure of these components. When a failure does occur, a replacement of the entire device is required because it is not feasible to open the encapsulation to replace a defective component.

It is an object of this invention to provide a simplified electrical device combining semiconductor elements and non-integrated components in an integral package.

It is another object of this invention to provide a simplified, electrical device combining semiconductor elements and non-integrated components which facilitates repair or adjustment of the non-integrated components used, thereby reducing the replacement costs.

A further object of this invention is to provide a single electrical package containing a semiconductor element and ancillary non-integrated components of reduced cost and weight.

A feature of the invention is an intermediate shell on which components, such as toroidal coils, capacitors, etc., may be mounted. This intermediate shell may be hermetically sealed with a header and leads extending from the header.

An additional feature of the invention is an intermediate shell which permits the electrical connection of the non-integrated components with a semiconductor element which is hermetically sealed in an isolated container.

Another feature of the invention is a header for mounting semiconductor elements which may be hermetically sealed with an intermediate shell.

Still another feature of the invention is a header containing hermetically sealed external leads which extend inwardly so that selected of them may be connected to an intermediate shell.

A further feature of the invention is a cap for forming a permanent or temporary enclosure about the non-integrated components.

The invention will be illustrated by the accompanying drawing in which.

Figure 1:
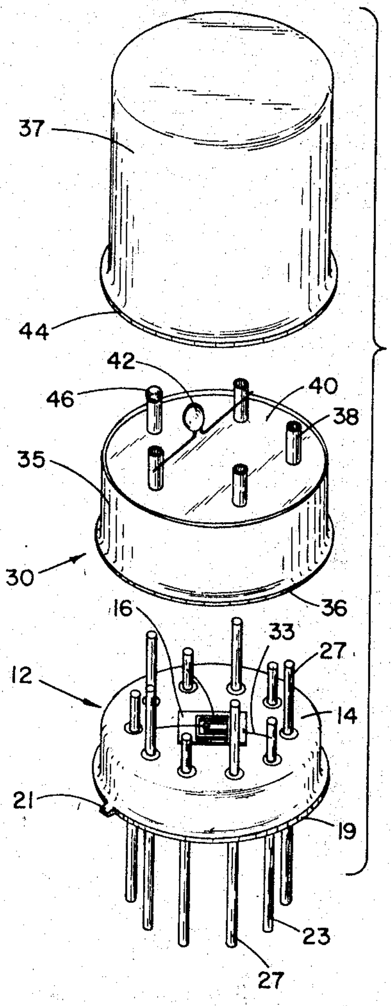
FIG. 1 is an exploded perspective view showing the parts forming a device of this invention.

A semiconductor device, in accordance with this invention, includes a header upon which a semiconductor element is mounted. An intermediate shell which is capable of being hermetically sealed with the header is disposed over this header. Receptacles are in disposed association with the intermediate shell for receiving leads extending through the header. Selected of these leads are extended a sufficient distance to be hermetically sealed with the receptacles. Selected of these leads are connected electrically to the semiconductor element. Non-integrated components are disposed on the intermediate shell on the side opposite the header. These non-integrated components are connected electrically to the extended leads from the header and means is provided for the protection of the non-integrated components.

The header upon which the semiconductor element is mounted will preferably be constructed of a material having a thermal expansion coefficient substantially the same as the semiconductor element mounted thereon. This header advantageously will be capable of dissipating sufficient heat to prevent the semiconductor element from overheating. The header may be constructed of many materials well known in the semicondctor art for these properties. Kovar, a metal alloy of iron, nickel, and cobalt, is an example of one of the many metal alloys which may be used that are compounded to approximate the coefficient of thermal expansion of silicon. Another suitable group of materials are the well known ceramics, e.g., refractory oxides, such as that used in the popular integrated circuit flat pack. Also, a filled epoxy or other high grade plastic material with a suitable heat sink may be utilized.

The leads, normally of a metal having a coefficient of thermal expansion similar to the header material and good electrical conductance, may be hermetically sealed in the header by one of the well known processes in the semiconductor art. Among these popular methods of sealing are glass to metal, soldering or thermo-compression welding.

The intermediate shell is preferably of a material capable of being hermetically sealed with the header. This material should also have a coefficient of thermal expansion similar to the header. The receptacles in the shell may be metal tubes hermetically sealed therein or openings in a ceramic lid which may be sealed about the leads using well known techniques. These receptacles, preferably, are just large enough to receive the extended leads. The intermediate shell forms a hermetically sealed package with the header thereby enclosing the semiconductor element. The sealed unit may be subjected to the stabilization and testing processes for the semiconductor element without the danger of damaging the non-integrated components.

A cap, for protecting the non-integrated components, is used to form either a permanent seal or a temporary seal with the intermediate shell and header. This cap may form a tight press fit or may be threaded if repeated access to these components is desired. After the non-integrated components are mounted, they may be completely encased in plastic if further access is not required. This plastic may be desirable in certain corrosive or physically damaging atmospheres.

A particular embodiment of the invention is shown in FIG. 1. A header assembly 12 composed of three parts forms the mounting area 14 for the semiconductor element 16. The top portion of this header assembly 12 is a metallic cover 18 made of a well known metal alloy, Kovar. Although Kovar is used throughout this embodiment, any of the other similar alloys could be used. This cover 18 is cylindrically shaped, closed on one end and flanged on the open end. The flange 19 serves as an area for joining the other parts of the package with the header assembly 12. An indexing tab 21 is formed on the flange 19 to aid in the assembly of the device and the rapid orientation of the device for insertion in an electrical circuit.

Figure 2:
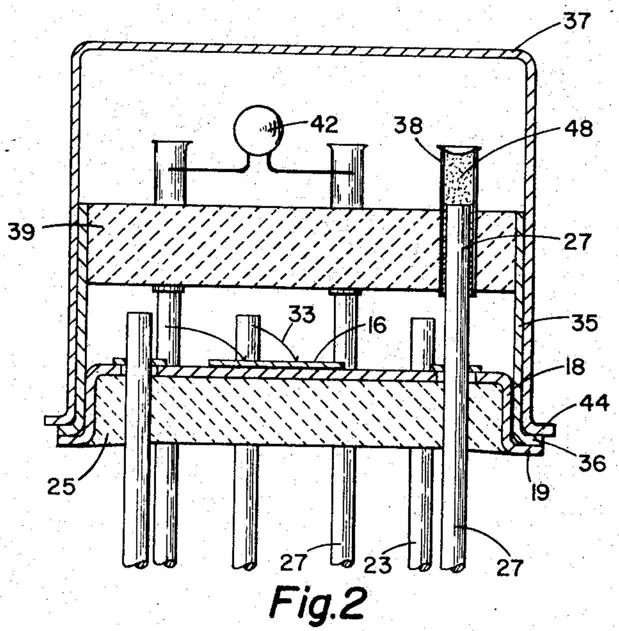
FIG. 2 is an enlarged cross-sectional view of a completed device assembled in accordance with one embodiment of this invention.

Leads 23, 27 are hermetically sealed to the shell 18 with glass 25, FIG. 2. These leads are located so that they will match the sockets or mounts to which the device is to be attached. The leads 23, 27 are used for joining the internal components of the device with an external circuit. Thereby a compact header assembly 12 is formed of parts with matching coefficients of expansion.

A semiconductor element 16 is mounted on the header 12 by one of the well known die bonding methods. This element 16 often will be an integrated circuit although various combinations of individual elements may be used. Fine wires 33, about 0.001 inch in diameter, are used to connect the semiconductor element 16 with selected leads 23, 27. The wires are connected to the bonding pads of the semiconductor element 16 and the leads 23, 27 by thermocompression welding. The wiring pattern will, of course, vary according to the desired circuit.

The intermediate shell 30 is composed of three parts. A cylinder 35 is formed of the metal Kovar. This cylinder 35 has a flange 36 on one of the open ends to aid in the forming of a hermetic seal between the shell 30 and the header 12 and the cap 37. Fine Kovar tubes 38, just large enough to allow the easy insertion of the extended leads 27, are orientated in the shell 30 and sealed thereto with glass 39. These tubes 38 serve as receptacles for the internally extended leads 27 and are of such construction that they may be conveniently used to form hermetic seals with the extended leads 27.

Top portion 40 of the shell 30 has an area for mounting the non-integrated components 42. These components 42 are connected to the receptacles 38 in the shell 30 by thermo-compression bonding of fine wires or by soldering the leads of the components. The receptacles are connected electrically to the extended leads 27 of the device when they are hermetically sealed with the extended leads 27.

A cap 37 is placed about the non-integrated components 42 to protect them from environmental conditions. This cap 37 is cylindrically shaped, closed on one end and has a flange 44 on the other end, which is open. The cap 37 fits over the components 42, the shell 30 and seats on the shell flange 36. The cap 37 is also constructed of Kovar so that it matches the properties of the balance of the assembly.

In the assembled device FIG. 2, the semiconductor element 16 is mounted on the header 12 and the desired electrical connections made. The semiconductor element 16 and the header 12 are baked at a desired temperature of about 150° C. to 300° C. After this initial stabilization treatment, the shell 30 is placed over the header 12 and the semiconductor element 16. Solder preforms 46 are then placed on the flared ends of the receptacles 38, FIG. 2. These parts are then subjected to a final bake, gas filling, and environmental conditioning. The shell 30 is hermetically sealed to the header 12 by welding the flanges 19, 36, and by melting the solder preforms 46. After melting, the solder 48 flows down the receptacles 38, thereby forming a hermetic seal around the leads 27.

Figure 3:
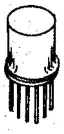
FIG. 3 is a perspective view showing the actual size of an assembled unit.

The non-integrated components 42 are now mounted on the shell 30 and connected electrically to the receptacles 38. The receptacles 38 are in good electrical contact with the extended leads 27 because of the solder seal 48. The cap 37 is placed over the components 42 and the cap flange 44 is welded to the flange 36 of the shell 30. In this manner a compact unit is formed as shown by the actual size representation FIG. 3.

In another embodiment of this invention, utilizing the structure shown in FIG. 1, the cap 37 is joined by forming a loose press fit with the shell 30. In this embodiment the cap 37 may be removed to allow the tuning of the enclosed components 42 or replacement of faulty components 42.

Figure 4:
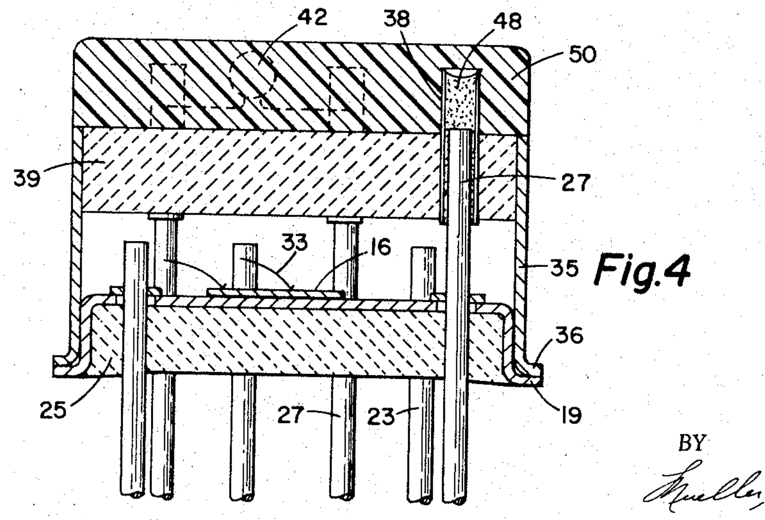
FIG. 4 is an enlarged cross-sectional view of a completed device assembled in accordance with another embodiment of this invention.

In still another embodiment of this invention FIG. 4, where it is desirable to protect the components 42 from a corrosive atmosphere or physical damage, an epoxy plastic 50 was used to encapsulate the components 42. This encapsulation was done by potting, although other molding methods would be satisfactory.

A device in accordance with this invention provides in a simplified, compact integral package a complicated electrical device combining semiconductor elements and non-integrated components. This device may be assembled in a manner which will allow access for repair, adjustment or replacement of the non-integrated components. The intermediate shell, which may be hermetically sealed to the header thereby providing two independent chambers, permits the combining electrically of semiconductor elements and non-integrated components in a single device. In this way a more efficient device of overall reduced weight and cost may be assembled approximating the size of the metal or ceramic package currently in popular use for integrated circuits and other semiconductor devices.

I claim:

1. An electrical device comprising a header,
a semiconductor element mounted on said header,
an intermediate shell disposed over said header and being hermetically sealed therewith,
receptacles in association with said intermediate shell and each receptacle forming electrical terminals on opposite sides of said shell for providing electrical connections therethrough,
leads extending through said header, selected of said leads extending a sufficient distance to make contact with said receptacles, selected of said leads being connected electrically to said semiconductor element,
non-integrated components disposed on the side of said intermediate shell opposite to said header and connected electrically to said extended leads, and
means for protecting said non-integrated components.

2. An electrical device comprising a header,
a semiconductor element mounted on said header,
an intermediate shell disposed over said header and being hermetically sealed therewith,
receptacles in association with said intermediate shell, said receptacles being hermetically sealed with said intermediate shell, leads extending through and hermetically sealed with said header, selected of said leads extending a sufficient distance to make contact with and be hermetically sealed with said receptacles, selected of said leads being connected electrically with said semiconductor element, non-integrated components disposed on the side of said intermediate shell opposite said header and connected electrically to said extended leads, and means for protecting said non-integrated components.

3. An electrical device according to claim 2 wherein said means for protecting said non-integrated components includes a plastic material disposed about said components.

4. An electrical device according to claim 2 wherein said intermediate shell includes joining means connecting said shell to said means for protecting said non-integrated components.

5. An electrical device comprising a header of a ceramic material a semiconductor element mounted on said header, an intermediate shell of a ceramic material disposed over said header and said semiconductor element, said intermediate shell being hermetically sealed with said header, receptacles in association with said intermediate shell and each receptacle forming electrical terminals on opposite sides of said shell for providing electrical connections therethrough, leads extending through and hermetically sealed with said header, selected of said leads extending a sufficient distance to make contact with and be hermetically sealed with said receptacles, selected of said leads being connected electrically with said semiconductor element, non-integrated components disposed on the side of said intermediate shell opposite said header, said components connected electrically to said extended leads, means for protecting said non-integrated components.

6. An electrical device comprising a metallic header, said header being formed from a metal alloy with a coefficient of thermal expansion similar to silicon, said header having a cylindrical shape which is closed on one end and flanged on the opposite end, a semiconductor element mounted on said header, an intermediate shell of the same material as said header having a cylindrical shape open on one end and flanged on the opposite end, said shell being disposed over said header with said flanges being hermetically sealed therewith, receptacles in association with said intermediate shell and hermetically sealed therewith, leads extending through said header, selected of said leads extending a sufficient distance to make contact with and be hermetically sealed with said receptacles, said leads being hermetically sealed to said header, said leads being connected electrically with said semiconductor element, non-integrated components disposed on the side of said intermediate shell opposite said header, said components being connected electrically to said extended leads and a cap having a cylindrical shape disposed about said non-integrated components and surrounding said intermediate shell, said cap being closed on one end and of a material substantially the same as said header.

No references cited.

LEWIS H. MYERS, *Primary Examiner.*

H. W. COLLINS, *Assistant Examiner.*